(12) United States Patent
Kim et al.

(10) Patent No.: US 12,266,516 B2
(45) Date of Patent: Apr. 1, 2025

(54) MAGNETRON SPUTTER DEVICE

(71) Applicant: DAEGU GYEONGBUK INSTITUTE OF SCIENCE AND TECHNOLOGY, Daegu (KR)

(72) Inventors: June Seo Kim, Anyang-si (KR); Joon Woo Kim, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 0 days.

(21) Appl. No.: 18/287,318

(22) PCT Filed: Apr. 7, 2022

(86) PCT No.: PCT/KR2022/005024
§ 371 (c)(1),
(2) Date: Oct. 18, 2023

(87) PCT Pub. No.: WO2022/225231
PCT Pub. Date: Oct. 27, 2022

(65) Prior Publication Data
US 2024/0203715 A1 Jun. 20, 2024

(30) Foreign Application Priority Data
Apr. 21, 2021 (KR) .......................... 10-2021-0051901

(51) Int. Cl.
*H01J 37/34* (2006.01)
*C23C 14/35* (2006.01)
(Continued)

(52) U.S. Cl.
CPC .......... *H01J 37/3405* (2013.01); *C23C 14/35* (2013.01); *C23C 14/56* (2013.01);
(Continued)

(58) Field of Classification Search
None
See application file for complete search history.

(56) References Cited

U.S. PATENT DOCUMENTS

| 4,957,605 A | * | 9/1990 | Hurwitt | ............ H01J 37/32935 |
| | | | | 204/298.18 |
| 2002/0046945 A1 | * | 4/2002 | Hosokawa | .............. C23C 14/56 |
| | | | | 204/298.18 |

(Continued)

FOREIGN PATENT DOCUMENTS

| JP | 2011-102427 | 5/2011 |
| JP | 2015-25171 | 2/2015 |

(Continued)

*Primary Examiner* — Jason Berman
(74) *Attorney, Agent, or Firm* — LEX IP MEISTER, PLLC

(57) ABSTRACT

A magnetron sputtering device according to the present disclosure includes a chamber having a vacuum state therein, a gas supply pipe configured to supply argon (Ar) gas into the chamber, a sputtering head provided within the chamber and including a sputtering target and a magnetic body disposed on a bottom end of the sputtering target to generate a magnetic field, a power supply configured to supply current to the sputtering target to generate plasma, a cooling device including a refrigerant pipe, through which refrigerant circulating from outside the chamber to the sputtering head, flows and configured to cool the sputtering head to a low temperature, a sputtering shield surrounding an area of the refrigerant pipe located outside the chamber and including a refrigerant inlet and a refrigerant outlet communicating with the refrigerant pipe, wherein the sputtering shield including a communication hole communicating with the chamber to have a vacuum state therein and the refrigerant pipe delivers the refrigerant while being disposed in a dual vacuum structure, wherein in the dual vacuum structure, an area of the refrigerant pipe located outside the (Continued)

chamber is disposed within the sputtering shield having the vacuum state, and an area of the refrigerant pipe located between the sputtering shield and the sputtering head is disposed within the chamber having the vacuum state.

14 Claims, 6 Drawing Sheets

(51) Int. Cl.
*C23C 14/56* (2006.01)
*H01J 37/18* (2006.01)

(52) U.S. Cl.
CPC .......... *H01J 37/18* (2013.01); *H01J 37/3414* (2013.01); *H01J 2237/002* (2013.01)

(56) References Cited

U.S. PATENT DOCUMENTS

| | | | | |
|---|---|---|---|---|
| 2008/0124903 | A1* | 5/2008 | England | H01J 37/3171 118/723 R |
| 2012/0138452 | A1* | 6/2012 | Anders | H01J 37/3497 204/298.03 |
| 2014/0076716 | A1* | 3/2014 | Gorokhovsky | C23C 14/35 204/192.12 |

FOREIGN PATENT DOCUMENTS

| | | |
|---|---|---|
| JP | 6552590 | 7/2019 |
| KR | 10-2005-0011315 | 1/2005 |
| KR | 10-0474983 | 4/2005 |
| KR | 10-2009-0061161 | 6/2009 |
| KR | 10-0948547 | 3/2010 |
| KR | 10-1528575 | 6/2015 |
| KR | 10-2016-0120339 | 10/2016 |
| KR | 10-2017-0128580 | 11/2017 |

* cited by examiner

[FIG. 1]
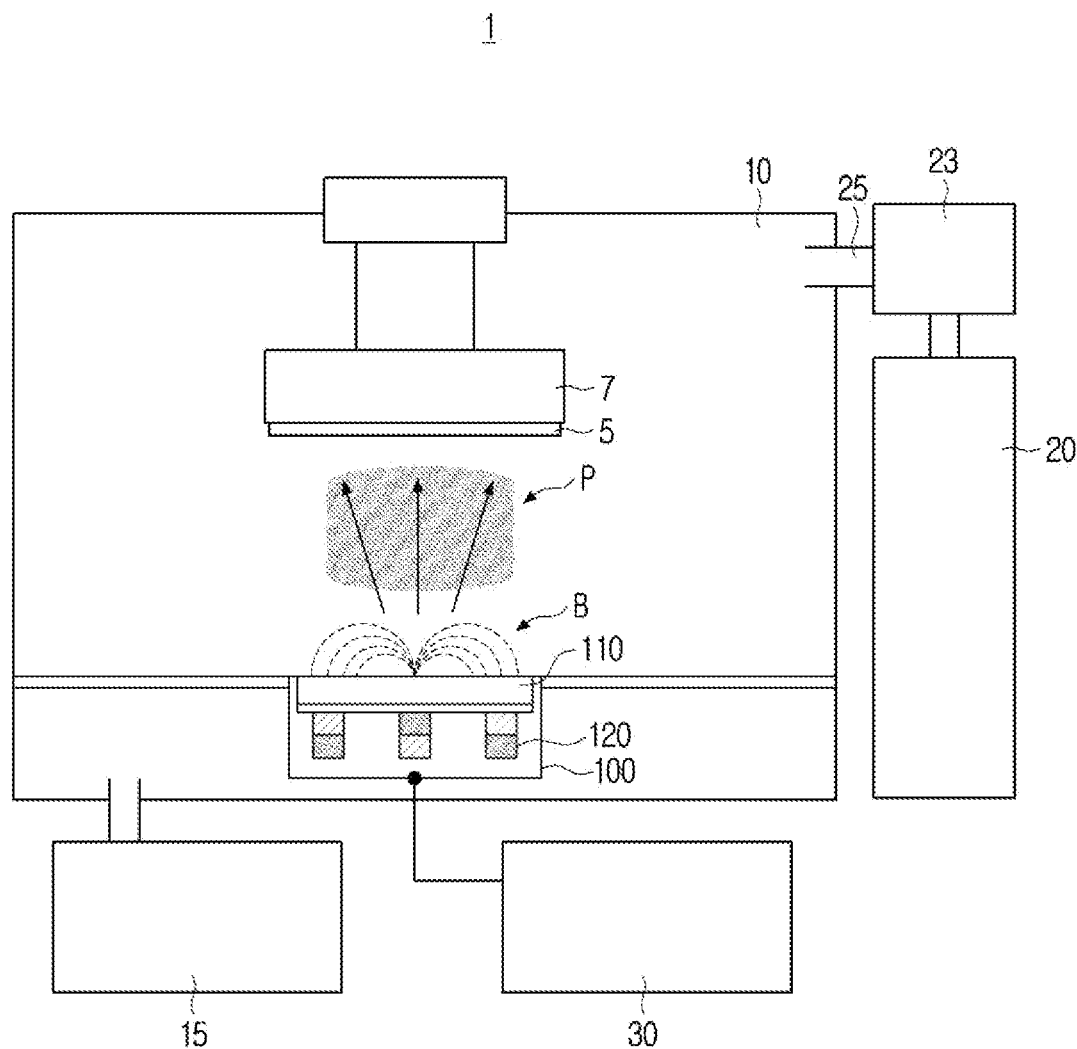

[FIG. 2]
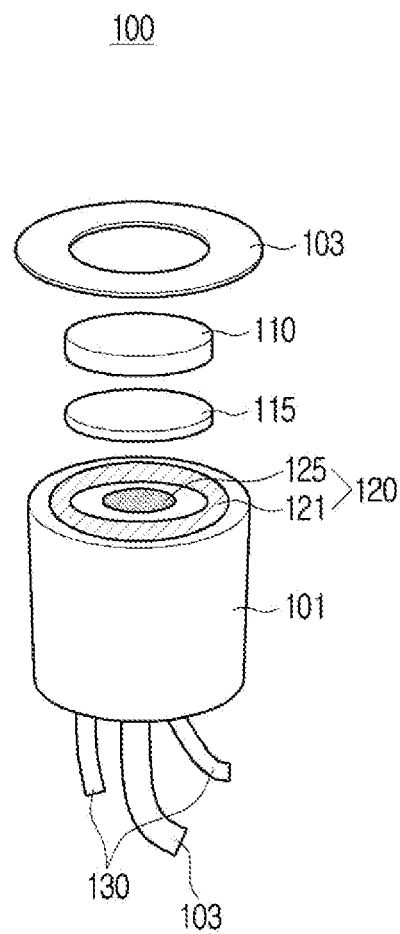
[FIG. 3]
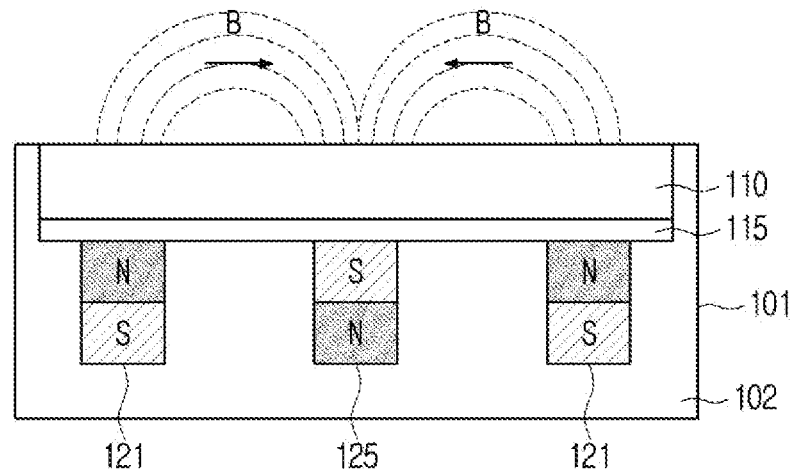

[FIG. 4]
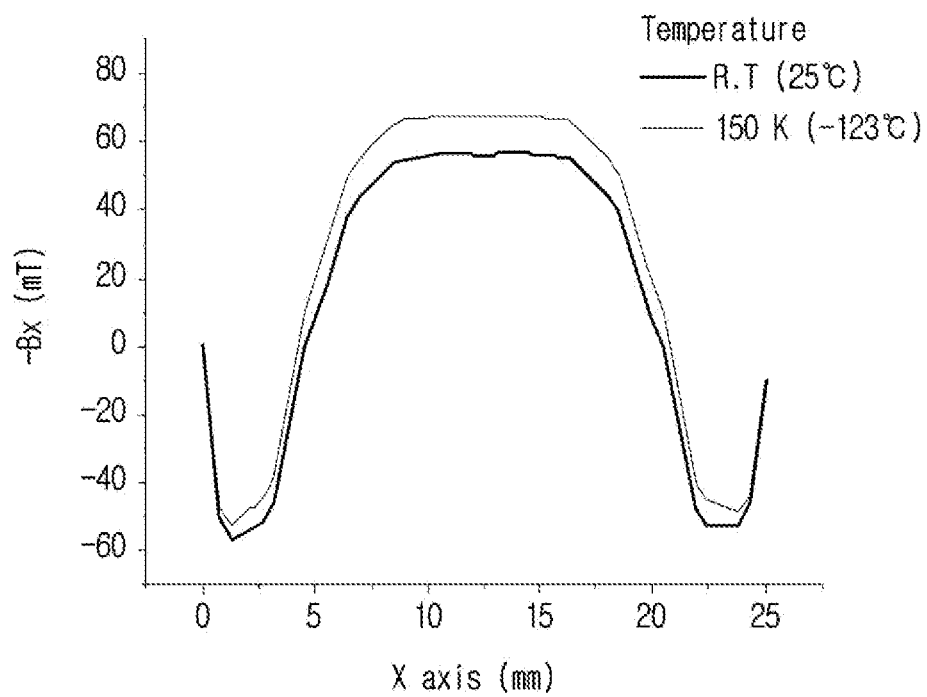
[FIG. 5]
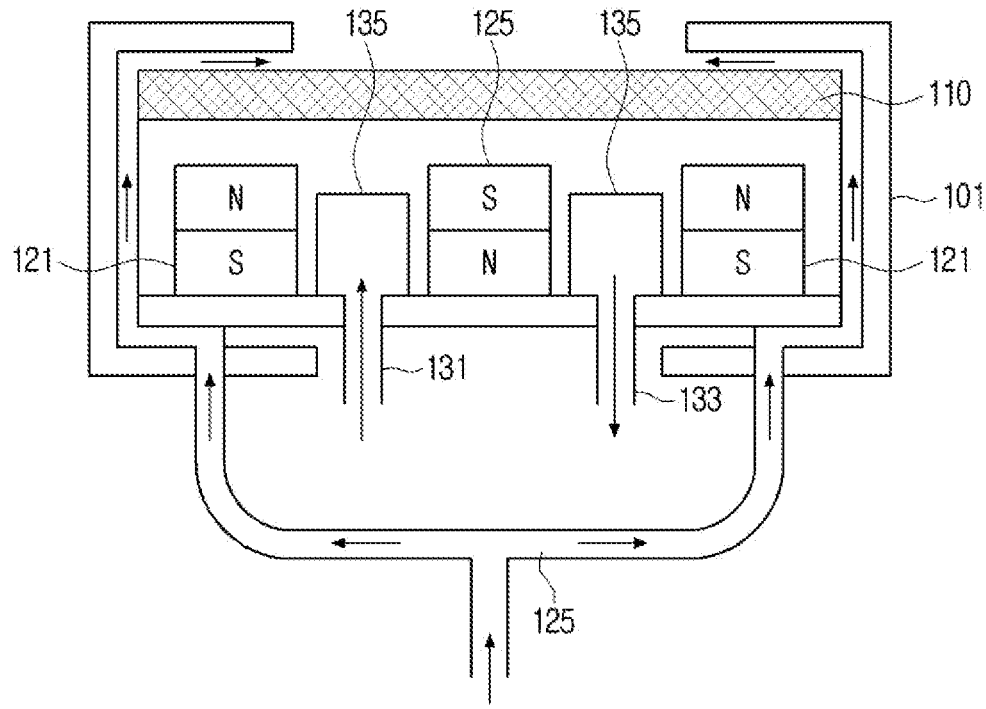

[FIG. 6]
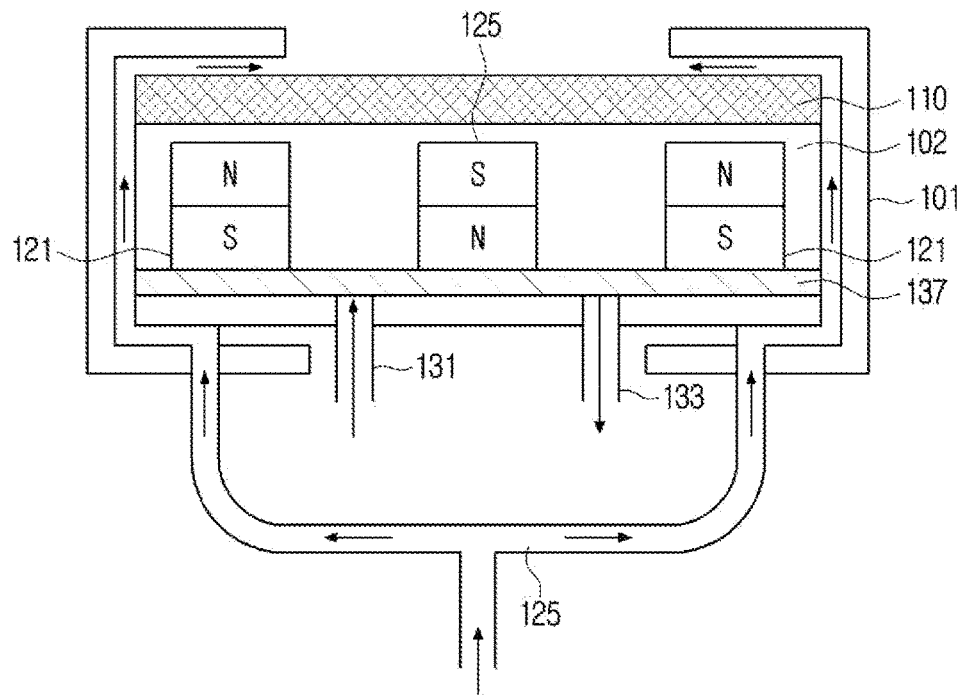
[FIG. 7]
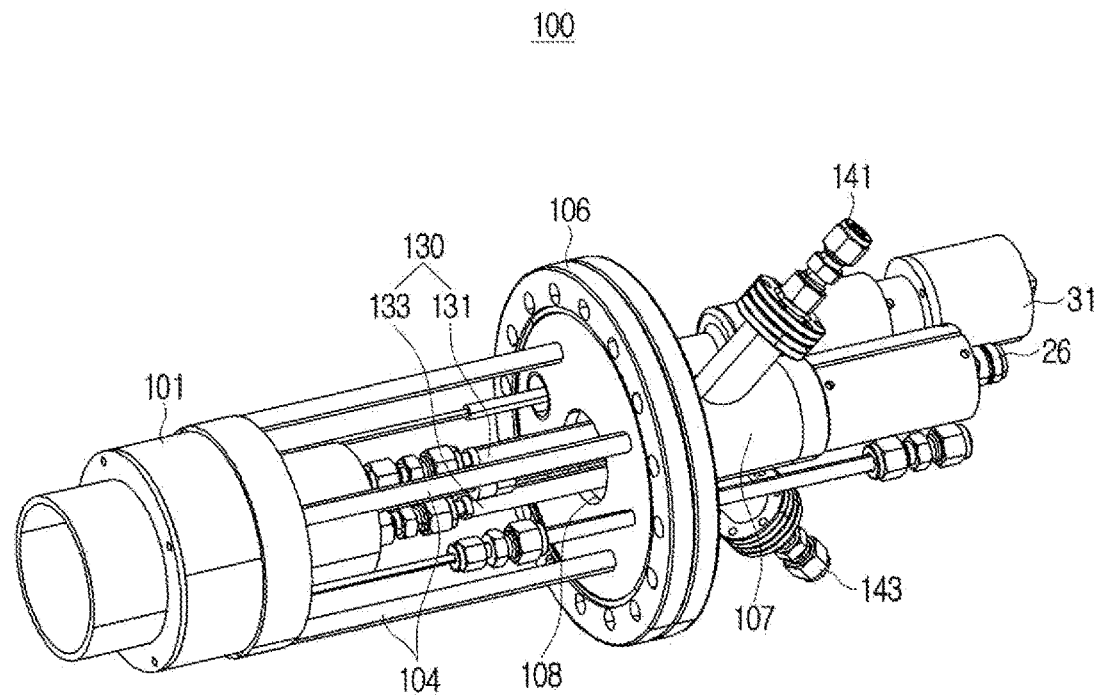

[FIG. 8]
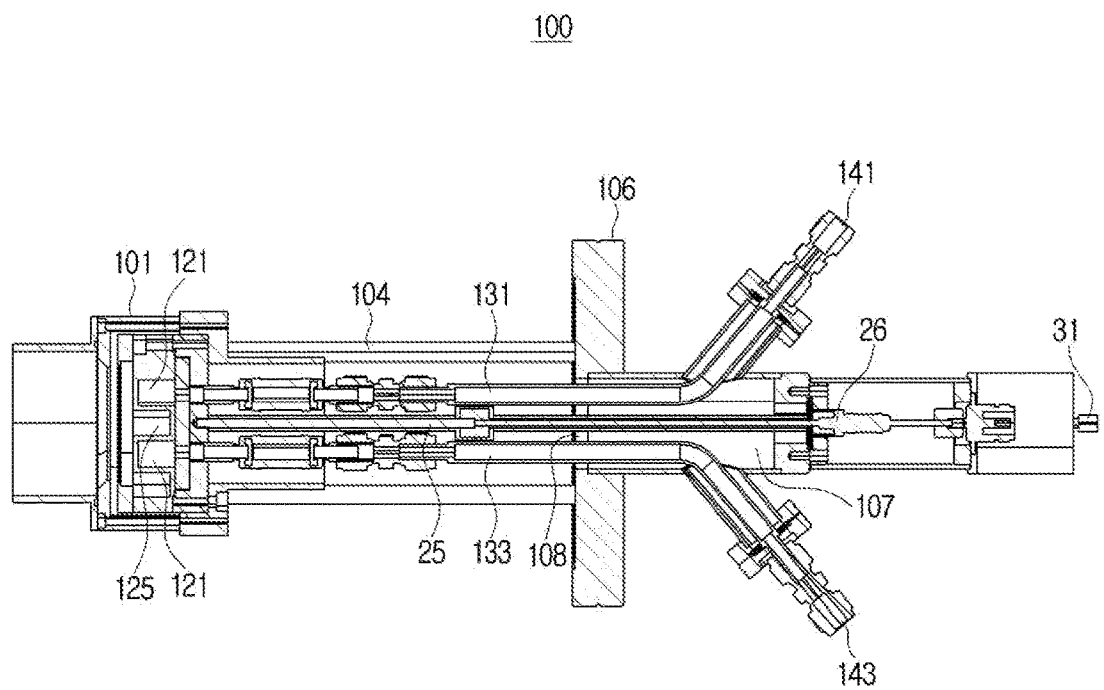
[FIG. 9]
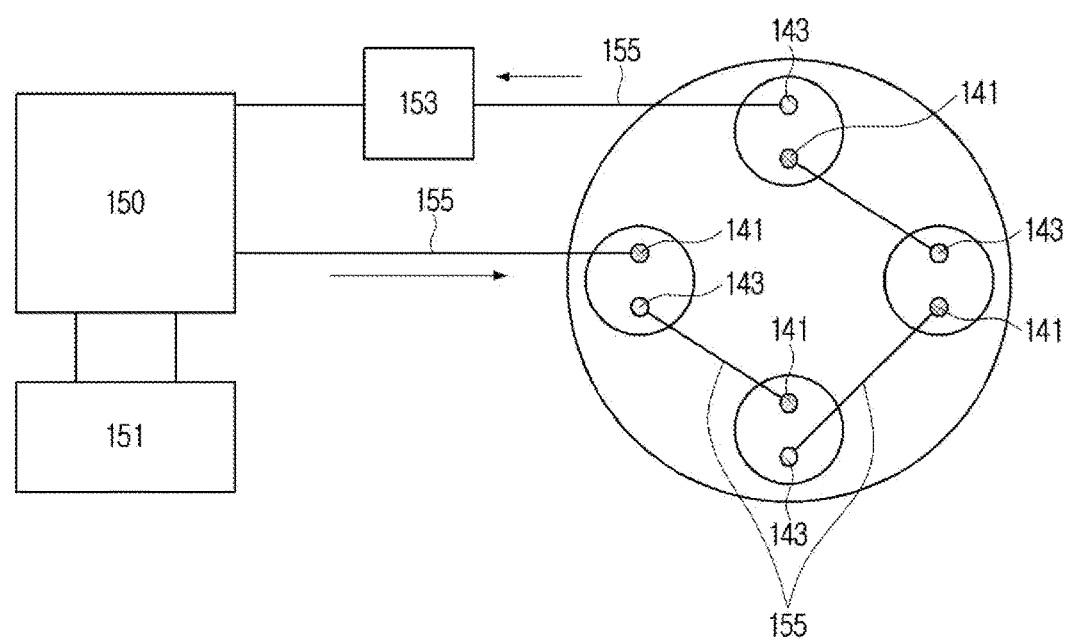

【FIG. 10】
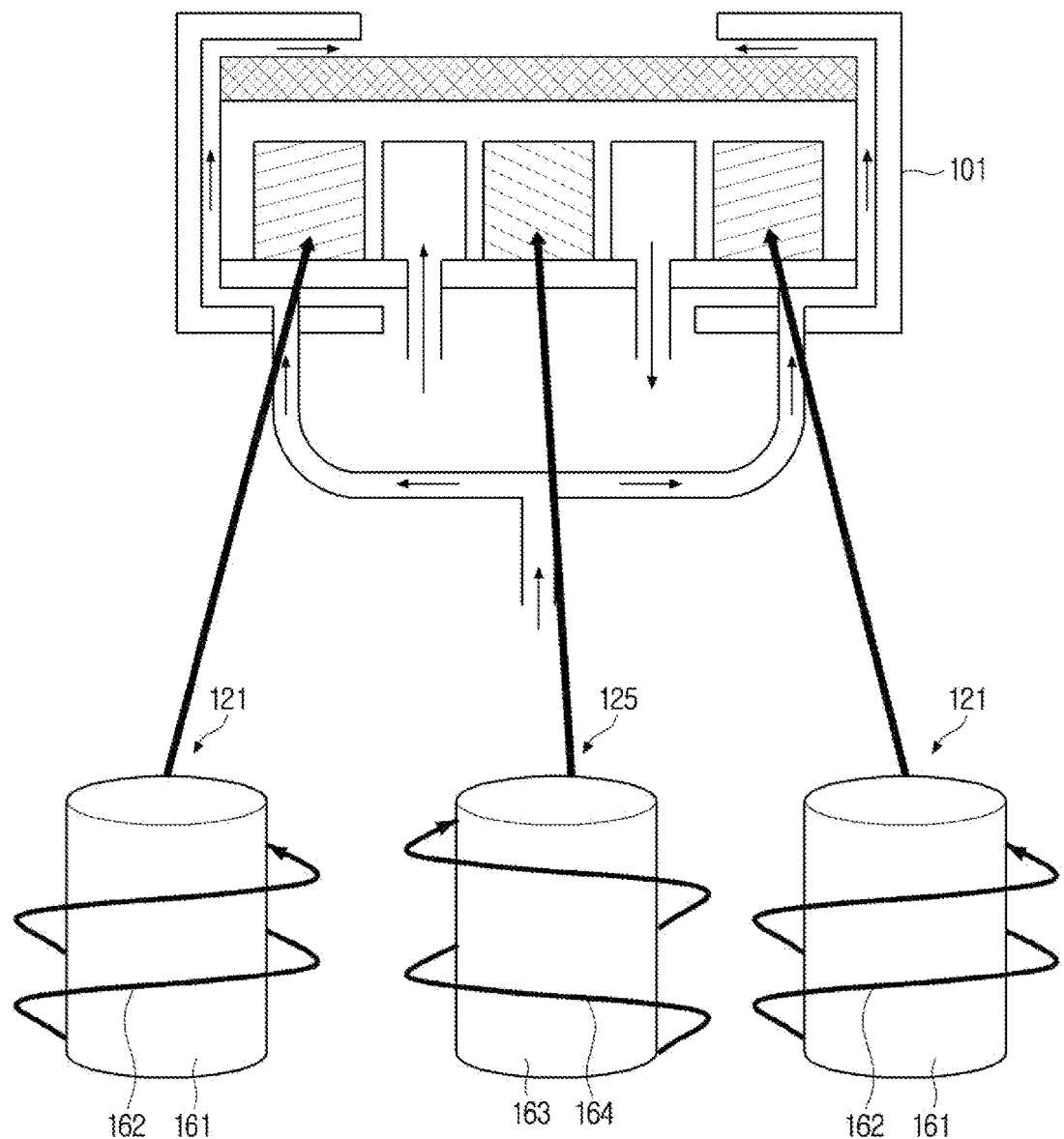

MAGNETRON SPUTTER DEVICE

TECHNICAL FIELD

The present disclosure relates to a magnetron sputtering device and, more particularly, to a magnetron sputtering device including a sputtering ion source cooled using a cooling device including a refrigerant pipe disposed in a dual vacuum structure.

BACKGROUND ART

Sputtering is a deposition method forming a film on a substrate by generating plasma in a vacuum environment and accelerating ionized gas to collide with a sputtering target. The magnetron sputtering device can increase a deposition rate by placing a magnet or the like at the rear of the sputtering target.

A magnetron sputtering device of the related art has a drawback in that as the magnetron sputtering device is heated by the generation of plasma, the characteristics of the magnet are deteriorated and the performance of the device is degraded. For example, in permanent NdFeB magnets which have typically been used as permanent magnets, the strength of each magnet significantly decreases with increases in the temperature thereof.

In addition, a copper plate located on a sputtering head may be deformed by heat or an area of a sputtering target may be locally eroded, thereby lowering the usability of the sputtering target.

In addition, when a magnetic target is mounted on a sputtering ion source, it is necessary to use a thin magnetic target due to the distortion of a magnetic field of the permanent magnets and the magnetic target within the sputtering ion source. Thus, in the case of periodic replacement of the target, a large amount of maintenance time and costs are required.

In order to solve this problem, conventional magnetron sputtering devices respectively include a cooling device using a water cooling method to cool the magnet. However, the water cooling method has limited cooling performance. As the magnetron sputtering device is driven, the cooling performance thereof tends to deteriorate. Furthermore, when the sputtering drive rate increases, the device may overheat and thus the cooling device may be deformed, thereby leading to a problem such as water leakage or magnet oxidation.

DETAILED DESCRIPTION OF THE DISCLOSURE

Technical Problem

In order to solve the above-described problems, a magnetron sputtering device according to the present disclosure is intended to improve temperature maintaining performance of a refrigerant by forming a vacuum state around a refrigerant pipe.

In addition, the magnetron sputtering device according to the present disclosure includes a cryogenic cooling device using a liquefied gas as refrigerant so as to improve the performance of cooling permanent magnets, and is also intended to improve the driving efficiency of a cooling device and improve the performance of the magnetron sputtering device by improving the structure of a sputtering ion source by realizing the cryogenic cooling device.

In addition, the magnetron sputtering device according to the present disclosure is intended to reduce maintenance costs and time by increasing the thickness of a mountable magnetic target by improving magnetic field characteristics of permanent magnets in the sputtering ion source.

In addition, the magnetron sputtering device according to the present disclosure is intended to improve the performance and efficiency of the magnetron sputtering device including the cryogenic cooling device through an embodiment including superconducting magnets for generating a magnetic field in at extremely low temperatures.

Technical Solution to Problem

According to various embodiment of the present disclosure, provided is a magnetron sputtering device including: a chamber having a vacuum state therein; a gas supply pipe configured to supply argon (Ar) gas into the chamber; a sputtering head provided within the chamber, and including a sputtering target and a magnetic body disposed on a bottom end of the sputtering target to generate a magnetic field; a power supply configured to supply current to the sputtering target to generate plasma; a cooling device including a refrigerant pipe, through which refrigerant circulating from outside the chamber to the sputtering head, flows, and configured to cool the sputtering head to a low temperature; and a sputtering shield surrounding an area of the refrigerant pipe located outside the chamber, and including a refrigerant inlet and a refrigerant outlet communicating with the refrigerant pipe, wherein the sputtering shield includes a communication hole communicating with the chamber to have a vacuum state therein.

In this case, the sputtering head may include the plurality of magnetic bodies. The plurality of magnetic bodies may include a first magnetic body having the N pole in the direction of the sputtering target, and a second magnetic body spaced apart from the first magnetic body and having the S pole in the direction of the sputtering target.

In this case, the first magnetic body may have a shape with an open central area, and the second magnetic body may be disposed in the central area of the first magnetic body.

In addition, the refrigerant pipe may be provided in the space between the first magnetic body and the second magnetic body to cool the sputtering head.

In addition, the refrigerant pipe may be provided on bottom ends of the first magnetic body and the second magnetic body to cool the sputtering head.

In addition, the plurality of sputtering heads may be present within the chamber, the plurality of sputtering shields may be present to correspond to the plurality of sputtering heads, respectively, and each of the plurality of sputtering shields may have the communication hole to have the vacuum state therein.

In this case, the cooling device may include an external refrigerant pipe connecting the refrigerant outlet of one sputtering shield among the plurality of sputtering shields and the refrigerant inlet of another sputtering shield among the plurality of sputtering shields.

In this case, the cooling device may cool the refrigerant received from the refrigerant outlet of the other sputtering shield and inject the refrigerant into the refrigerant inlet of the one sputtering shield.

In addition, the interior of the refrigerant pipe may have a vacuum state to prevent heat loss of the refrigerant.

In addition, the magnetic body may include: a core having magnetism; and a coil wound on an outer circumferential surface of the core in one direction, whereby the magnetic body generates a magnetic field when current is supplied to the coil.

In this case, the sputtering head may include the plurality of magnetic bodies. The plurality of magnetic bodies may include: a first magnetic body in which a first coil is wound on an outer circumferential surface of a first core in a first direction, and a second magnetic body spaced apart from the first magnetic body and in which a second coil is wound on an outer circumferential surface of a second core in a second direction opposite the first direction.

In addition, the coil may include a superconducting wire.

In addition, the coil may be supplied with power from the power supply.

In addition, the magnetron sputtering device may further include: a processor configured to control the operation of the cooling device and the power supply; and a sensor configured to sense a temperature of the sputtering head and provide the sensed temperature to the processor.

In this case, the processor may control the power supply based on the temperature of the sputtering head to supply the current to the coil.

In addition, the lower portion of the sputtering target of the sputtering head may be filled with high pressure fiberglass.

In addition, the cooling device may cool the sputtering head by a water cooling method.

In addition, the refrigerant may be a liquefied gas, and the cooling device may cool the sputtering heat to an extremely low temperature.

Advantageous Effects of Disclosure

The magnetron sputtering device according to various embodiments of the present disclosure may improve cooling performance of the magnet cooling device, improve cooling efficiency and increase the thickness of the magnetic target when the magnetic target is used so as to reduce maintenance costs and time in periodic replacement of the target, and generate a magnetic field using superconducting magnets at extremely low temperatures so as to improve the performance and efficiency of the magnetron sputtering device.

BRIEF DESCRIPTION OF DRAWINGS

FIG. 1 is a view illustrating a magnetron sputtering device according to an embodiment of the present disclosure.

FIG. 2 is an exploded perspective view illustrating the sputtering ion source according to an embodiment of the present disclosure.

FIG. 3 is a view illustrating the sputtering head according to an embodiment of the present disclosure.

FIG. 4 is a graph of simulation data values illustrating magnetic field strengths according to the temperature of the magnetron sputtering device according to an embodiment of the present disclosure.

FIG. 5 is a cross-sectional view illustrating the sputtering head according to an embodiment of the present disclosure.

FIG. 6 is a cross-sectional view illustrating the sputtering head according to an embodiment of the present disclosure.

FIG. 7 is a perspective view illustrating the sputtering ion source according to an embodiment of the present disclosure.

FIG. 8 is a cross-sectional view illustrating the sputtering ion source according to an embodiment of the present disclosure.

FIG. 9 is a view illustrating the cooling device according to an embodiment of the present disclosure.

FIG. 10 is a view illustrating the sputtering head and the magnetic bodies according to an embodiment of the present disclosure.

BEST MODE

Terms used in herein will be briefly described before a detailed description of the present disclosure. In the description of the present disclosure, a detailed description of related known technology will be omitted, and repeated descriptions of the same components will be omitted as much as possible.

The terms used in describing embodiments of the present disclosure are selected from common terms currently in widespread use as much as possible in consideration of their functions in the present disclosure, but the meanings thereof may change according to the intention of a person skilled in the art to which the present disclosure pertains, judicial precedents, and the emergence of new technologies. In addition, in certain cases, a term which is not commonly used in the art to which the present disclosure pertains may be selected. In such a case, the meaning of the term will be described in detail in the corresponding portion of the description of the present disclosure. Therefore, the terms used in various embodiments of the present disclosure should be defined based on the meanings of the terms and the descriptions provided herein, instead of being based on simple names of the terms.

The embodiments of the present disclosure may be variously changed and include various embodiments, and specific embodiments will be shown in the drawings and described in detail in the description. However, it should be understood that this is not to limit the scope of the specific embodiments and all modifications, equivalents, and/or alternatives included in the disclosed spirit and technical scope are included. In describing the present disclosure, a detailed description of the related art may be omitted when it is determined that the detailed description may unnecessarily obscure the gist of the present disclosure.

The terms "first," "second," or the like may be used for describing various elements but the elements may not be limited by the terms. The terms are used only to distinguish one element from another. For example, a first component may be referred to as a second component without departing from the scope of right of the present disclosure. Similarly, a second component may be referred to as a first component.

Unless otherwise defined specifically, a singular expression may encompass a plural expression. It is to be understood that the terms such as "comprise" or "consist of" are used herein to designate the presence of characteristic, number, step, operation, element, part, or a combination thereof and not to preclude the presence or possibility of adding one or more of other characteristics, numbers, steps, operations, elements, parts or a combination thereof.

The term such as "module" or a "unit" in the present disclosure may perform at least one function or operation, and may be implemented as hardware, software, or a combination of hardware and software. Further, except for when each of a plurality of "modules", "units", and the like needs to be implemented as individual hardware, the components may be integrated into at least one module and be implemented as at least one processor.

Hereinafter, with reference to the accompanying drawings, embodiments of the present disclosure will be described in detail so that a person skilled in the art to which the present disclosure pertains could easily put the present disclosure into practice. But, the present disclosure may be implemented in various different forms and is not limited to the embodiments described herein. In addition, in the drawings, the parts not relating to the description are omitted for the sake of brevity of the present disclosure, and the same reference numerals are used for the same parts throughout the specification.

Furthermore, embodiments of the present disclosure will be described in detail with reference to the accompanying drawings and the contents illustrated in the accompanying drawings, but the present disclosure is not limited or restricted thereby.

Hereinafter, the structure and operation of a magnetron sputtering device according to the present disclosure will be described in detail with reference to FIGS. 1 to 10.

FIG. 1 is a view illustrating a magnetron sputtering device 1 according to an embodiment of the present disclosure.

Referring to FIG. 1, the magnetron sputtering device 1 according to an embodiment of the present disclosure may include a chamber 10, a gas supply pipe 25, a sputtering ion source 100, or a power supply 30.

The magnetron sputtering device 1 is a device ionizing a metal by generating plasma in the chamber 10 having a vacuum state so that the ionized metal is deposited on a target substrate to form a thin film thereon.

Specifically, the magnetron sputtering device 1 applies a strong electric field around the sputtering target 110 in a perpendicular direction so that argon (Ar) gas is dissociated into plasma and ionized, so that a magnetic field generated using magnetic bodies 120 and the electric field cause the Ar gas in the plasma state to collide with the sputtering target 110, thereby ionizing the sputtering target 110. Consequently, the ionized atoms may realize fine deposition, thereby forming a thin film.

A vacuum pump 15 may vacuum the interior of the chamber 10 to have vacuum state. A target substrate 5 and a holder 7 supporting the target substrate 5 may be provided within the chamber 10.

In the chamber 10, the sputtering target 110 may be disposed at a position opposite to the target substrate 5. Plasma P may be generated between the sputtering target 110 and the target substrate 5, and metal ion may be deposited on the target substrate, thereby forming the thin film.

The gas supply pipe 25 may be connected to a mass flow meter 23 and/or a gas supply 23 to supply Ar gas into the chamber 10. The gas supplied is not limited to Ar, and may be replaced with another inert gas or a gas having similar properties. It is illustrated in FIG. 1 that the gas supply pipe 25 is connected to one side of the chamber 10, but in an actual implementation, the gas supply pipe 25 may be disposed adjacent to a sputtering head 101 to directly supply Ar gas to the sputtering target 110.

The mass flow meter 23, i.e., a mass flow controller (MFC), is a device accurately measuring and controlling the amount of gas supplied into the chamber 10 from the gas supply 23. A plurality of mass flow meters 23 may be included depending on the type of gas, the sputtering target 110, or the like.

The sputtering ion source 100 is provided within the chamber 10, and includes the sputtering head 101 (see FIG. 2) and a sputtering shield 107 (see FIG. 7). The sputtering head 101 may include the sputtering target 110 and the magnetic bodies 120 disposed on the bottom end of the sputtering target 110 to generate a magnetic field.

The sputtering ion source 100 may be supplied with power from the power supply 30. The power supply 30 may supply the sputtering target 110 with current, more particularly, DC current, to generate an electric field and, as a result, generate plasma within the chamber 10.

The magnetic bodies 120 are disposed on the rear surface of the sputtering target 110 to generate a magnetic field B. The magnetic field may promote the ionization of gas particles, increase the intensity of the plasma, and significantly increase the deposition rate. The sputtering ion source 100 may include a plurality of permanent magnets as the magnetic bodies 120, and generate the magnetic field B parallel to the sputtering target 110.

FIG. 2 is an exploded perspective view illustrating the sputtering ion source 100 according to an embodiment of the present disclosure, and FIG. 3 is a view illustrating the sputtering head 101 according to an embodiment of the present disclosure.

Referring to FIGS. 2 and 3, the sputtering ion source 100 may include the sputtering head 101, a cover 103, a copper (Cu) plate 115, refrigerant pipes 130, and power supply lines 35.

The sputtering head 101 may include a plurality of magnetic bodies 120 therein. The plurality of magnetic bodies 120 may include a first magnetic body 121 and a second magnetic body 125. The first magnetic body 121 may have the N pole in the direction of the sputtering target 110, and the second magnetic body 125 may be spaced apart from the first magnetic body 121 and have the S pole in the direction of the sputtering target 110.

According to various embodiments, as illustrated in FIG. 2, the first magnetic body 121 may have a cylindrical shape with the open central area and a doughnut-shaped cross-section, and the second magnetic body 125 may be disposed in the central area of the first magnetic body 121. Due to this arrangement structure, the magnetic field B may be generated in the direction from the periphery to the center of the sputtering target 110 as illustrated in FIG. 3. According to an embodiment, the first magnetic body 121 and/or the second magnetic body 125 may be implemented as a group in which a plurality of permanent magnets are arranged.

The cover 103 may be disposed on the top surface of the sputtering target 110. The cover 103 may have a shape by which at least a portion of the top surface thereof is open, so that a portion of the top surface of the sputtering target 110 is exposed to the outside. The Cu plate 115 may be disposed on the bottom surface of the sputtering target 110, and the magnetic bodies 120 may be disposed on the bottom surface of the Cu plate 115. The refrigerant pipes 130 and the power supply lines 35 may be provided on the lower portion of the sputtering head 101.

The interior of the sputtering head 101 may be filled with a filler 102, and the filler 102 may be high pressure fiberglass. The filler 102 such as the high pressure fiberglass is a low heat conductivity material, and thus, the filler 102 may be disposed below the sputtering target 110 to improve heat insulating performance of the sputtering head. Since the sputtering head 101 is cooled to a low temperature using refrigerant as described below, the high pressure fiberglass may assist in maintaining the interior of the sputtering head 101 in a cryogenic state. In various embodiments, the filler 102 may be replaced with expanded polystyrene or a plastic film.

The power supply lines 35 may supply power from the power supply 30 to the sputtering head 101. The arrangement structure of the refrigerant pipes 130 will be described in detail below with reference to FIG. 5 and the following figures.

FIG. 4 is a graph of simulation data values illustrating magnetic field strengths according to the temperature of the magnetron sputtering device 1 according to an embodiment of the present disclosure.

Specifically, referring to FIG. 4, there is a graph illustrating the magnetic field strengths of the top surface of the sputtering target when the temperature of the sputtering target 110 is room temperature (R. T, 25° C.) and when the sputtering target 110 is in a cryogenic state (150 K or −123° C. Celsius).

The X-axis is a position at which the center of the top surface of the sputtering target 110 is set 0 mm, the first magnetic body 121 is disposed at a position between 1 mm and 5 mm, and the second magnetic body 125 is disposed at a position between 20 mm and 25 mm. In addition, the Y-axis indicates the magnetic field strengths corresponding to respective positions of the top surface of the sputtering target 110.

Referring to FIG. 4, it can be seen that the magnetic field strengths on the top surface of the sputtering target 110 in the cryogenic state were increased about 20% from the room temperature state.

When the temperature of the sputtering head 101 is maintained at an extremely low temperature, the magnetic field strength of the sputtering ion source 100 may be increased and the driving efficiency and thin film forming rate of the magnetron sputtering device 1 and the quality of the formed thin film may be improved. In addition, the Cu plate 115 or the sputtering target 110 of the sputtering head 101 may be prevented from deteriorating, and the usability thereof may be improved.

Hereinafter, the structure of a cooling device 150 and the structure of the magnetic bodies 120 that the magnetron sputtering device according to the present disclosure includes in order to realize and maintain the cryogenic state of the sputtering head 101 will be described in detail.

FIG. 5 is a cross-sectional view illustrating the sputtering head 101 according to an embodiment of the present disclosure, and FIG. 6 is a cross-sectional view illustrating the sputtering head 101 according to an embodiment of the present disclosure.

Referring to FIGS. 5 and 6, the refrigerant pipes 130 may include an inlet pipe 131 and an outlet pipe 133, and may include circulation flow paths 135 or a cooling chamber 137. In addition, the gas supply pipe 25 may supply Ar gas to the top surface of the sputtering target 110 from the bottom end of the sputtering head 101.

The cooling device 150 may be provided outside the sputtering head 101 to cool the sputtering head 101 through the refrigerant pipes 130. The refrigerant pipes 130 are guide paths through which refrigerant circulating from the cooling device 150 disposed outside the chamber 10 to the sputtering head 101 flows. The refrigerant pipes 130 may include the inlet pipe 131 through which refrigerant is supplied to the sputtering head 101 and the outlet pipe 133 through which refrigerant is discharged from the sputtering head 101.

The interior of the refrigerant pipes 130 may have a vacuum state to prevent heat loss of refrigerant and minimize heat exchange between the refrigerant and the air within the refrigerant pipes or between the refrigerant and the outside while the refrigerant is flowing to the sputtering head 101. The inlet pipe 131 and the outlet pipe 133 may be made of an insulating material. The circulation flow paths 135 and the cooling chamber 137 may be made of a material having a relatively high heat conductivity that facilitates heat exchange with the outside.

Referring to FIG. 5, the refrigerant pipes 130 may include the circulation flow paths 135. The circulation flow paths 135 of the refrigerant pipes 130 may be provided in the space between the first magnetic body 121 and the second magnetic body 125 to circulate refrigerant and directly cool the sputtering head 101.

Since the circulation flow paths 135 directly cool the plurality of magnetic bodies 120, the circulation flow paths 135 may be adjacent to a heat source of the sputtering head 101 to directly cool the heat source. It may be advantageous to maintain the sputtering head 101 in a cryogenic state.

Referring to FIG. 6, the refrigerant pipes 130 may include the cooling chamber 137. The cooling chamber 137 of the refrigerant pipes 130 may be provided on the bottom ends of the first magnetic body 121 and the second magnetic body 125 to cool the sputtering head 101 by conduction. The outer circumferential surface of the cooling chamber 137 may be made of a high heat conductivity material such as Cu.

The structure of the cooling chamber 137 may be easily designed than the structure of the circulation flow paths 135. The cooling chamber 137 may uniformly cool the entire area of the sputtering head 101. The filler 102 may be disposed between the magnetic bodies 120 to improve heat insulating performance.

FIG. 7 is a perspective view illustrating the sputtering ion source 100 according to an embodiment of the present disclosure, and FIG. 8 is a cross-sectional view illustrating the sputtering ion source 100 according to an embodiment of the present disclosure.

Referring to FIGS. 7 and 8, the sputtering ion source 100 according to an embodiment of the present disclosure may include a support 104, a coupling part 106, the sputtering shield 107.

The support 104 may extend from the coupling part 106 into the chamber 10 and support the sputtering head 101. The refrigerant pipes 130 and the gas supply pipe 25 may be located within the support 104. The refrigerant pipes 130 and the gas supply pipe 25 may extend through a communication hole 108 formed in the coupling part 106 and the sputtering shield 107 to be connected to the sputtering head 101.

The coupling part 106 may be coupled to a coupling portion of the chamber 10 in an airtight manner to support the sputtering ion source 100. The sputtering ion source 100 may be provided with the sputtering shield 107 located outside the chamber 10 with respect to the coupling part 106.

The sputtering shield 107 may be a housing surrounding areas of the refrigerant pipes 130 located outside the chamber 10. The sputtering shield 107 may include a refrigerant inlet 141 communicating with the inlet pipe 131 of the refrigerant pipes 130 and a refrigerant outlet 143 communicating with the outlet pipe 133 of the refrigerant pipes 130.

In various embodiments, the sputtering shield 107 may be provided with a gas inlet 26 to supply Ar gas into the sputtering head 101 through the gas supply pipe 25. An electrode 31 is provided on a side of the sputtering shield 107 to supply DC current to the sputtering head 101 from the power supply 30.

The sputtering shield 107 may have the communication hole 108 communicating with the chamber 10. The interior of the sputtering shield 107 communicates with the interior of the chamber 10, so that the interior of the sputtering shield 107 may also have a vacuum state. As the sputtering shield 107 has the vacuum state, the refrigerant pipes 130 may be disposed in the interiors of the chamber 10 and the sputtering shield 107 each having the vacuum state to deliver refrigerant. In this case, it is possible to prevent heat exchange between the refrigerant pipes 130 and the outside and prevent the problem of moisture condensation due to the heat exchange between the refrigerant pipes 130 and the outside. Accordingly, the sputtering shield 107 may improve heat insulating performance by minimizing the heat exchange of the refrigerant pipes 130 within the sputtering shield 107 and efficiently maintain the low temperature state of refrigerant within the refrigerant pipes 130.

FIG. 9 is a view illustrating the cooling device 150 according to an embodiment of the present disclosure.

Referring to FIG. 9, the cooling device 150 may include a cooling pump 153, a compressor 151, and an external refrigerant pipe 155.

The cooling device 150 may be connected to the compressor 151 to cool refrigerant. The cooling pump 153 may induce circulation of the refrigerant. The refrigerant cooling device 150 and the compressor 151 are generally known in the art and thus a detailed description thereof will be omitted.

The cooling device 150 may cool the sputtering head 101 by a water cooling method. Alternatively, the refrigerant may be implemented as a liquefied gas, and the liquefied gas may flow through the refrigerant pipes 130 to cool the sputtering head 101 to an extremely low temperature. In this case, the refrigerant within the refrigerant pipes 130 may be implemented as various types of gases, for example, liquid nitrogen, liquid helium, or liquid hydrogen. Hereinafter, the refrigerant will be described as being a liquefied gas but is not limited thereto. The cooling device 150 according to an embodiment may use a water cooling method or various types of refrigerants.

The magnetron sputtering device 1 according to various embodiments of the present disclosure may cool the sputtering head 101 at an extremely low temperature using the liquefied gas so as to maximize cooling performance compared to a case in which a typical refrigerant is used and to maintain the sputtering head 101 in a cryogenic state.

The cooling device 150 may cool the sputtering ion source 100 to maintain the cryogenic state by supplying the liquefied gas.

The magnetron sputtering device 1 may include a plurality of sputtering ion sources 100. That is, a plurality of sputtering ion sources 100 may be present within the chamber 10, and a plurality of sputtering shields 107 may be present to correspond to the plurality of sputtering ion sources 100, respectively.

In this case, the cooling device 150 may include the external refrigerant pipe 155 connecting the refrigerant outlet 143 of one sputtering shield 107 among the plurality of sputtering shields 107 to the refrigerant inlet 141 of another sputtering shield 107 among the plurality of sputtering shields 107. The external refrigerant pipe 155 may respectively be implemented as a metal pipe, the interior of which has a vacuum state, in order to improve heat insulating performance.

The cooling device 150 may inject the liquefied gas into the refrigerant inlet 141 of one sputtering shield 107 among the plurality of sputtering shields 107 and receive the liquefied gas from the refrigerant outlet 143 of another sputtering shield 107 among the plurality of sputtering shields 107.

The cooling device 150 is configured such that the liquefied gas circulates through the plurality of sputtering shields 107 through the external refrigerant pipe 155 and the above-described structure. The cooling device 150 may cool the plurality of sputtering heads 101 by one-way circulation without being connected to each of the sputtering shields 107.

In addition, the cooling device 150 may have a closed circulation structure by which the liquefied gas received from the refrigerant outlet 143 of one sputtering shield 107 is injected again into the refrigerant inlet 141 of another sputtering shield 107.

Due to the closed circulation structure, the cooling device 150 may use the liquefied gas, which is gasified or temperature-increased, by liquefying and cooling the liquefied gas again even if the liquefied gas is not continuously supplied.

FIG. 10 is a view illustrating the sputtering head 101 and the magnetic bodies 120 according to an embodiment of the present disclosure.

Referring to FIG. 10, the magnetic bodies 120 according to an embodiment of the present disclosure may include cores 161 and 163 and coils 162 and 164.

Each of the magnetic bodies 120 may include the core 161 or 163 having magnetism and the coil 162 or 164 wound on the outer circumference of the core 161 or 163 in one direction. When the coil 162 or 164 is supplied with current, the magnetic body 120 may generate a magnetic field.

In this case, in the first magnetic body 121 and the second magnetic body 125, the coils 162 and 164 are wound on the cores 161 and 163 in different directions. Specifically, the first magnetic body 121 may include the first core 161 and the first coil 162, and may have a structure in which the first coil 162 is wound on the first core 161 in a first direction. In addition, the second magnetic body 125 may include the second core 163 and the second coil 164, and have a structure in which the second coil 164 is wound on the second core 163 in a second direction opposite the first direction.

According to these structures, when a direct current is applied, the first magnetic body 121 and the second magnetic body 125 may generate magnetic fields in opposite directions, and the upper portion of the first magnetic body 121 disposed in the central portion of the sputtering head 101 may form the S pole, and the upper portion of the second magnetic body 125 disposed in the next side of central portion of the sputtering head 101 may form the N pole. In addition, in various embodiments, a plurality of second magnetic bodies 125 may be present such that a plurality of second coils 162 are wound on a plurality of second cores 163, respectively, and the plurality of second magnetic bodies 125 may surround the outer surface of the sputtering head 101.

Each of the coils 162 and 164 according to various embodiments may include a superconducting wire, and may be supplied with power from the power supply 30. The superconducting wire may be implemented using a pure metal or a ceramic compound. For example, the superconducting wire may include a material having a low critical temperature, a low magnetic field strength, and a high current density. The superconducting wire may be implemented as a wire type in the shape of a typical electrical wire or a film type, or may be implemented as a fiber cable type including a plurality of superconducting sub-electrical wires therein.

The magnetic bodies 120 including a superconducting wire may be referred to as superconducting magnets. The superconducting magnets may have no resistance at extremely low temperatures of, for example, 4.2 K or lower, thereby realizing permanent current.

Compared to typical resistive magnets, the superconducting magnets using the coils 162 and 164 of the superconducting wires according to the present disclosure may reduce power consumption required to generate the same magnetic field and reduce energy consumption for cooling.

The magnetron sputtering device 1 according to various embodiments may include a processor (not shown) controlling the operation of the cooling device 150 and the power supply 30 and a sensor (not shown) sensing the temperature of the sputtering head 101 and providing the processor with the sensed temperature. In this case, the processor may control the power supply 30 on the basis of the temperature of the sputtering head 101 and control the strength and direction of current supplied to the coils 162 and 164 or the drive time.

As the processor controls current applied to the coils 162 and 164, the superconducting magnet may selectively increase the range in which the magnetic field is generated compared to the resistive magnet and may realize various shapes of magnetic field distribution, and it is possible to control the strength and direction of the magnetic field by adjusting the strength and direction of the current.

Accordingly, the magnetron sputtering device 1 can control the thickness of a thin film to be formed and improve the deposition rate and uniformity of the thin film. It is possible to easily adjust the thickness of the magnetic target. It is also possible to form a thick thin film by stacking microscopic thin films.

Although the exemplary embodiments of the present disclosure have been shown and described, the present disclosure is not limited to the aforementioned specific embodiments, and it is apparent that various modifications can be made by a person having ordinary knowledge in the art to which the present disclosure pertains, without departing from the gist of the present disclosure as claimed by the appended claims. It is also intended that such modifications are not to be interpreted independently from the technical idea or prospect of the present disclosure.

The invention claimed is:

1. A magnetron sputtering device comprising:
a chamber having a vacuum state therein;
a gas supply pipe configured to supply argon (Ar) gas into the chamber;
a sputtering head provided within the chamber, and comprising a sputtering target and a magnetic body disposed on a bottom end of the sputtering target to generate a magnetic field;
a power supply configured to supply current to the sputtering target to generate plasma;
a cooling device comprising a refrigerant pipe, through which refrigerant circulating from outside the chamber to the sputtering head, flows, and configured to cool the sputtering head to a low temperature; and
a sputtering shield surrounding an area of the refrigerant pipe located outside the chamber, and comprising a gas inlet communicating with the gas supply pipe, a refrigerant inlet and a refrigerant outlet communicating with the refrigerant pipe,
wherein the sputtering shield includes a communication hole communicating with the chamber to have a vacuum state therein, and
the refrigerant pipe delivers the refrigerant while being disposed in a dual vacuum structure, wherein in the dual vacuum structure,
an area of the refrigerant pipe located outside the chamber is disposed within the sputtering shield having the vacuum state, and
an area of the refrigerant pipe located between the sputtering shield and the sputtering head is disposed within the chamber having the vacuum state,
wherein the gas supply pipe extends through the sputtering shield to connect the gas inlet to the sputtering head.

2. The magnetron sputtering device of claim 1, wherein the sputtering head comprises the magnetic body in plurality, and
the plurality of magnetic bodies include
a first magnetic body having an N pole in the direction of the sputtering target, and
a second magnetic body spaced apart from the first magnetic body and having an S pole in the direction of the sputtering target.

3. The magnetron sputtering device of claim 2, wherein the first magnetic body has a shape with an open central area, and
the second magnetic body is disposed in the central area of the first magnetic body.

4. The magnetron sputtering device of claim 2, wherein the refrigerant pipe is provided in a space between the first magnetic body and the second magnetic body to cool the sputtering head.

5. The magnetron sputtering device of claim 2, wherein the refrigerant pipe is provided on bottom ends of the first magnetic body and the second magnetic body to cool the sputtering head.

6. The magnetron sputtering device of claim 1, wherein the sputtering head exists in plural within the chamber,
the sputtering shield exists in plural to correspond to the plurality of sputtering heads, respectively, and
each of the plurality of sputtering shields has the communication hole to have the vacuum state therein.

7. The magnetron sputtering device of claim 6, wherein the cooling device comprises an external refrigerant pipe connecting a refrigerant outlet of one sputtering shield among the plurality of sputtering shields to a refrigerant inlet of another sputtering shield among the plurality of sputtering shields.

8. The magnetron sputtering device of claim 7, wherein the cooling device cools the refrigerant received from the refrigerant outlet of the other sputtering shield and injects the refrigerant into the refrigerant inlet of the one sputtering shield.

9. The magnetron sputtering device of claim 1, wherein the magnetic body comprises:
a core having magnetism; and
a coil wound on an outer circumferential surface of the core in one direction,
whereby the magnetic body generates a magnetic field when current is supplied to the coil.

10. The magnetron sputtering device of claim 9, wherein the sputtering head comprises the plurality of magnetic bodies, and
the plurality of magnetic bodies include:
a first magnetic body in which a first coil is wound on an outer circumferential surface of a first core in a first direction, and
a second magnetic body spaced apart from the first magnetic body in which a second coil is wound on an outer circumferential surface of a second core in a second direction opposite the first direction.

11. The magnetron sputtering device of claim 9, wherein the coil comprises a superconducting wire.

12. The magnetron sputtering device of claim 9, wherein the coil is supplied with power from the power supply.

13. The magnetron sputtering device of claim 12, further comprising:
- a processor configured to control the operation of the cooling device and the power supply; and
- a sensor configured to sense a temperature of the sputtering head and provide the same to the processor.

14. The magnetron sputtering device of claim 13, wherein the processor is further configured to control the power supply based on the temperature of the sputtering head to supply the current to the coil.

* * * * *